United States Patent
Kadner

(10) Patent No.: US 7,183,773 B2
(45) Date of Patent: Feb. 27, 2007

(54) METHOD AND CIRCUIT ARRANGEMENT FOR THE SELF-TESTING OF A REFERENCE VOLTAGE IN ELECTRONIC COMPONENTS

(75) Inventor: Martin Kadner, Hamburg (DE)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 10/562,075

(22) PCT Filed: Jun. 14, 2004

(86) PCT No.: PCT/IB2004/050897

§ 371 (c)(1),
(2), (4) Date: Dec. 22, 2005

(87) PCT Pub. No.: WO2004/113938

PCT Pub. Date: Dec. 29, 2004

(65) Prior Publication Data

US 2006/0181282 A1    Aug. 17, 2006

(30) Foreign Application Priority Data

Jun. 25, 2003    (EP) .................................. 03101869

(51) Int. Cl.
*G01R 31/08*    (2006.01)
*G01R 19/00*    (2006.01)

(52) U.S. Cl. ................... 324/524; 324/522; 324/76.11; 702/64

(58) Field of Classification Search ............. 324/76.13, 324/76.11, 524, 522; 702/64
See application file for complete search history.

(56) References Cited

U.S. PATENT DOCUMENTS 3,931,502 A  *  1/1976  Kohlas ........................ 702/59

* cited by examiner

Primary Examiner—Andrew H. Hirshfeld
Assistant Examiner—Amy He

(57) ABSTRACT

To provide a method for the self-testing of a reference voltage in electronic components, by means of which method there is defined a circuit arrangement for a self-test of the reference voltage that can be implemented in the form of an on-chip test, i.e. for which no external reference-voltage source is required, provision is made for the reference voltage $(U_{ref})$ to be the variable of a function $f(U_{ref})$ that has an extreme at the point where the selected nominal value $(U_{ref.test})$ of the reference voltage $(U_{ref})$ is situated and, in a self-test, for the values of the function to be determined in succession for the reference voltage (Uref) and for two further test voltages $(U_{ref}+\Delta U_{ref}; U_{ref}-\Delta U_{ref})$ that differ from the reference voltage $(U_{ref})$ by only small positive and negative amounts $(+\Delta U_{ref}; -\Delta U_{ref})$ respectively and for these values to be compared with one another and, if the values of the function for the test voltages $(U_{ref}+\Delta U_{ref}; U_{ref}-\Delta U_{ref})$ differ from the value of the function for the reference voltage $(U_{ref})$ in the same direction, for a pass signal to be generated, or if not, for a fail signal to be generated.

2 Claims, 1 Drawing Sheet

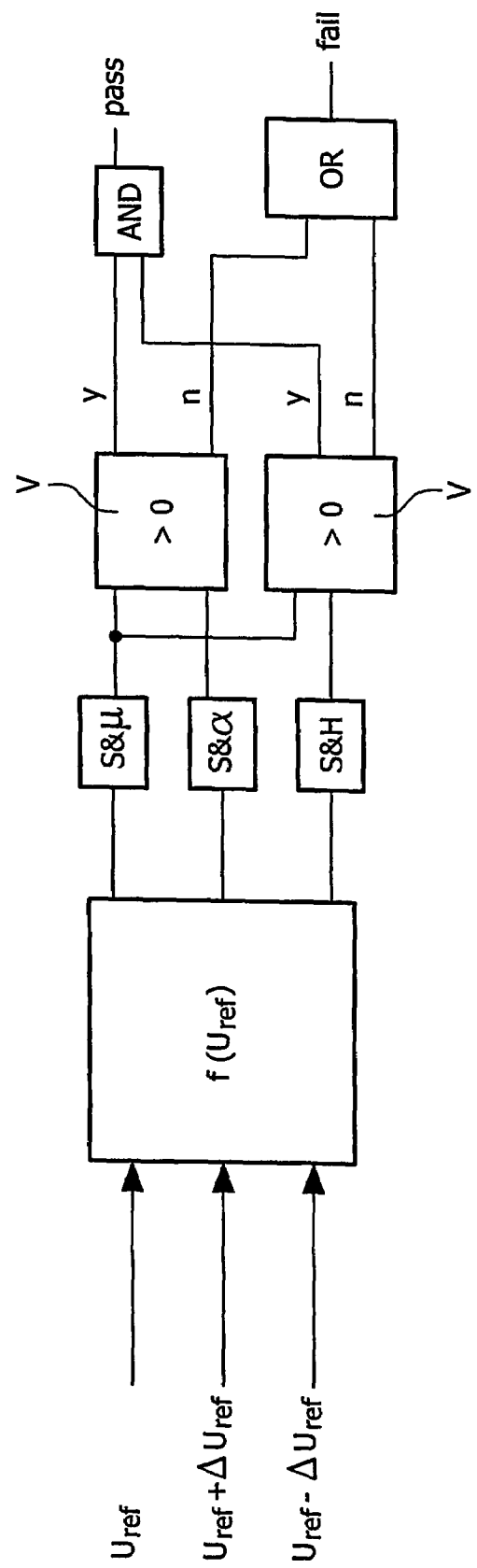

METHOD AND CIRCUIT ARRANGEMENT FOR THE SELF-TESTING OF A REFERENCE VOLTAGE IN ELECTRONIC COMPONENTS

The invention relates to a method and a circuit arrangement for the self-testing of a reference voltage in electronic components.

During the production process, but also when operating in the field, integrated circuits need to be tested to ensure they are operating correctly. Because there are many disadvantages to using external testing devices, given that contact has to be made with each chip individually and subsequent testing of the chip under operating conditions is no longer possible, testing circuits built into the chip itself have become an established practice. This method of testing is known by the name BIST (Built-In Self-Test). BIST gives a chip a closed-loop procedure for identifying faults.

The circuits are often fitted with internally regulated voltage sources that are used as sources of reference voltages for comparison with voltages or currents within the integrated circuitry belonging to the circuits. These reference-voltage sources are intended to be as insensitive as possible to the effects of temperature and to external power-supply means from which the voltages fluctuate. To enable a test to be made to check that these conditions are being met, it is known for the reference voltage from a source of this kind to be compared with an external reference voltage. This has the disadvantage that has already been described above for BIST, namely that when the chip is operating in the field contact has to be made with it from outside, which involves an unusual amount of circuitry and cost.

It is an object of the invention to specify a circuit arrangement for the self-testing of the reference voltage that can be implemented as an on-chip test, i.e. for which no external reference-voltage source is required.

Under these, the reference voltage is the variable of a function that has an extreme at the point where the selected nominal value of the selected reference voltage is situated. In a self-test, the values of the function are determined in succession for the reference voltage and for two further test voltages that differ from the reference voltage by only small positive and negative amounts respectively and these values of the function are compared with one another. If the values of the function for the test voltages differ from the value of the function for the reference voltage in the same direction a pass signal is generated, or if not a, fail signal.

An associated circuit arrangement comprises a function generator having a function that has an extreme at the point where the selected nominal value of the reference voltage is situated. The input signals to the function generator are the reference voltage and two further test voltages that differ from the reference voltage by only small negative and positive amounts respectively. The output signals from the function generator are fed to sample & hold circuits whose contents are compared in two comparison circuits for comparing the value of the function for the reference voltage with respective ones of the test voltages.

These and other aspects of the invention are apparent from and will be elucidated with reference to the embodiments described hereinafter.

In the drawings:

The single FIG. is a block circuit diagram of a corresponding testing arrangement.

What is taken as a basis is a mathematical function that meets the requirement $$\frac{df(x)}{dx} = 0 \text{ where } x = U_{ref.test}$$

where $U_{ref.test}$=nominal reference voltage.

What this means is that the function f, which depends on the reference voltage $U_{ref}$ to be tested, has an extreme at the point where the nominal voltage $U_{ref.test}$ is situated. If, in what follows, two further test voltages are selected that differ from the reference voltage $U_{ref}$ by only a small amount $\Delta U_{ref}$, then the values of the function that can be expected for them are either smaller than the value for the voltage $U_{ref}$ for testing when there is a maximum at the point at which the nominal voltage $U_{ref.test}$ is situated, or are larger than it when there is a minimum at the said point.

The function $f=(U_{ref})^3-U_{ref.test}$ for example has a clear minimum value at the point $U_{ref.test}$.

The FIGURE is a block circuit diagram of a reference-voltage test that operates on the basis according to the invention. In this case, three values are applied in succession to one and the same block (test) that represents the function described above. The output values are stored in respective sample & hold circuits. Once all the values of the function have been determined, the relationships between the results given by the reference voltage $U_{ref}$ and by the minimal shifts by the voltage $\Delta U_{ref}$ are analyzed, i.e. they are compared with one another in comparators V. If the two values differ from the value of the function for the reference voltage $U_{ref}$ in the same direction, in the positive direction in the present example, this means that the value for the reference voltage $U_{ref}$ is at the extreme of the function f(x) employed in the block test and the reference voltage is thus at its nominal value $U_{ref.test}$. The result of the test on the reference voltage $U_{ref}$ is then passed on via an AND circuit as a pass signal. Otherwise a fail signal is emitted. This happens if a comparison of the value of the function for the test voltage $U_{ref}+\Delta U_{ref}$ or $U_{ref}-\Delta U_{ref}$ shows it to be larger than the value of the function for the reference voltage $U_{ref}$ and the other value then to be smaller than that for the reference voltage $U_{ref}$. The comparator circuits may be of any desired form and have a pass or fail signal as an output.

Because of the manufacturing tolerance in the production process, a once-only calibration of the f(x) function in the block test is necessary for each chip.

LIST OF REFERENCE NUMERALS

V Comparator
$U_{ref}$ Reference voltage
$\Delta U_{ref}$ Value of difference from reference voltage
S&H Sample & hold circuit
pass Pass signal
fail Fail signal

The invention claimed is:

1. A method for the self-testing of a reference voltage in electronic components, characterized in that the reference voltage is the variable of a function that has an extreme at the point where the selected nominal value of the reference voltage is situated and in a self-test, the values of the function are determined in succession for the reference voltage and for two further test voltages that differ from the reference voltage by only small positive and negative amounts respectively and these values are compared with one another, and if the values of the function for the test voltages differ from the value of the function for the reference voltage in the same direction a pass signal is generated, or if not, a fail signal is generated.

2. A circuit arrangement for the self-testing of a reference voltage in electronic components, characterized in that it comprises a function generator having a function that has an extreme at the point where the selected nominal value of the reference voltage is situated, and the input signals to which function generator are the reference voltage and two further test voltages that differ from the reference voltage by only small positive and negative amounts respectively, and the output signals from which function generator are fed to sample & hold circuits, and in that it comprises two comparator circuits for comparing the values of the function for the reference voltage and for respective test voltages, the outputs of which comparator circuits generate a pass signal if the signs of the signals at them are the same, and a fail signal if they are not.

\* \* \* \* \*